United States Patent
Sato et al.

(10) Patent No.: US 7,468,881 B2
(45) Date of Patent: Dec. 23, 2008

(54) MULTILAYER ELECTRONIC COMPONENT

(75) Inventors: Takahiro Sato, Tokyo (JP); Kentaro Yoshida, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/987,378

(22) Filed: Nov. 29, 2007

(65) Prior Publication Data

US 2008/0136561 A1   Jun. 12, 2008

(30) Foreign Application Priority Data

Dec. 7, 2006   (JP)   ............................. 2006-330891

(51) Int. Cl.
   *H01G 4/228*   (2006.01)
(52) U.S. Cl. .............. 361/306.3; 361/306.1; 361/321.1; 361/321.2; 361/311; 361/313
(58) Field of Classification Search .............. 361/306.3, 361/306.1, 301.2, 301.4, 302–305, 311–313, 361/321.1, 321.2, 308.1; 333/185, 186
See application file for complete search history.

(56) References Cited

U.S. PATENT DOCUMENTS

| | | | |
|---|---|---|---|
| 6,002,308 A * | 12/1999 | Gamo | 333/187 |
| 6,243,253 B1 * | 6/2001 | DuPre et al. | 361/306.3 |
| 6,433,995 B2 * | 8/2002 | Nakagawa et al. | 361/311 |
| 6,759,926 B2 * | 7/2004 | Yamaguchi | 333/175 |
| 7,336,144 B2 * | 2/2008 | Lee et al. | 333/204 |
| 7,411,775 B2 * | 8/2008 | Togashi | 361/303 |
| 2003/0099083 A1 * | 5/2003 | Ohtsuka et al. | 361/303 |

FOREIGN PATENT DOCUMENTS

| | | |
|---|---|---|
| JP | A-07-220906 | 8/1995 |
| JP | A-2003-051729 | 2/2003 |
| JP | A-2005-064267 | 3/2005 |
| JP | A-2006-013154 | 1/2006 |
| JP | A-2006-041081 | 2/2006 |
| JP | A-2006-041820 | 2/2006 |
| JP | A-2006-115460 | 4/2006 |
| JP | A-2006-140173 | 6/2006 |
| JP | A-2006-310712 | 11/2006 |
| JP | A-2007-500442 | 1/2007 |
| JP | A-2007-194494 | 8/2007 |
| JP | A-2007-195060 | 8/2007 |
| JP | A-2007-227473 | 9/2007 |

* cited by examiner

*Primary Examiner*—Nguyen T Ha
(74) *Attorney, Agent, or Firm*—Oliff & Berridge, PLC

(57) ABSTRACT

A multilayer electronic component has: a first capacitive electrode layer of a rectangular shape on which four capacitive electrode portions are formed at four corners; and a ground electrode layer which is laid on the first capacitive electrode layer and on which a ground electrode is formed so as to be arranged as superposed over the four capacitive electrode portions. The four capacitive electrode portions are equidistant from a first facing edge pair of the first capacitive electrode layer and equidistant from a second facing edge pair different from the first edge pair. This configuration equalizes distributions of electric fields established between the respective capacitive electrode portions and the ground electrode, which realizes uniformization of the capacitances in the four respective capacitive electrode portions.

4 Claims, 6 Drawing Sheets

(a)

(b)

MULTILAYER ELECTRONIC COMPONENT

BACKGROUND OF THE INVENTION

1. Field of the Invention

The present invention relates to a multilayer electronic component and, more particularly, to a multilayer electronic component with a filter function.

2. Related Background Art

A conventional multilayer electronic component in the field of this technology is disclosed, for example, in Japanese Patent Application Laid-open No. 2006-140173. In the multilayer electronic component described in this application, eight capacitive electrode portions (hot electrodes) facing a ground electrode are arrayed in two rows each consisting of four capacitive electrode portions, on the same surface.

SUMMARY OF THE INVENTION

However, the inventors' research showed that where four capacitive electrode portions were arranged in a row as in the above-described conventional multilayer electronic component, the capacitances of the capacitive electrode portions located inside in the row direction (which will be referred to hereinafter as inside capacitive electrode portions) became different from the capacitances of the capacitive electrode portions located outside (which will be referred to hereinafter as outside capacitive electrode portions).

It is considered that this is caused by the difference between distributions of electric fields established between the inside capacitive electrode portions and the ground electrode and distributions of electric fields established between the outside capacitive electrode portions and the ground electrode because of differences of distances to the end faces of the electronic component between the inside capacitive electrode portions and the outside capacitive electrode portions.

Therefore, the present invention has been accomplished in order to solve the above-described problem and an object of the invention is to provide a multilayer electronic component in which the capacitances of respective capacitive electrode portions are uniformized.

A multilayer electronic component according to the present invention is a multilayer electronic component comprising: a first capacitive electrode layer of a rectangular shape on which four capacitive electrode portions are formed at four corners; and a ground electrode layer which is laid on the first capacitive electrode layer and on which a ground electrode is formed so as to be arranged as superposed over the four capacitive electrode portions; wherein the four capacitive electrode portions are equidistant from a first facing edge pair of the first capacitive electrode layer and equidistant from a second facing edge pair different from the first edge pair.

In this multilayer electronic component, the four capacitive electrode portions are equidistant each from the first edge pair and from the second edge pair. For this reason, the distributions of electric fields established between the respective capacitive electrode portions and the ground electrode are made equal in this multilayer electronic component, which realizes uniformization of the capacitances in the four respective capacitive electrode portions.

The multilayer electronic component may be constructed in a configuration further comprising: a second capacitive electrode layer on which four capacitive electrode portions are formed and which is laid so as to sandwich the ground electrode layer between the second capacitive electrode layer and the first capacitive electrode layer, wherein the four capacitive electrode portions are arranged as superposed over the ground electrode on the ground electrode layer and are equidistant from a first facing edge pair of the second capacitive electrode layer and equidistant from a second facing edge pair different from the first edge pair. In this case, even if the multilayer electronic component has the eight capacitive electrode portions, the uniformization of the capacitances of the respective capacitive electrode portions is also achieved.

The multilayer electronic component may be constructed in a configuration further comprising an inductor section. In this case, the multilayer electronic component according to the present invention can be, for example, a composite electronic component functioning as a filter with a capacitor function or as a filter with a varistor function.

The present invention successfully provides the multilayer electronic component in which the capacitances of the respective capacitive electrode portions are uniformized.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

A mode believed to be the best for carrying out the present invention will be described below in detail with reference to the accompanying drawings. Identical or equivalent elements will be denoted by the same reference symbols and the description thereof will be omitted in the case of redundant description.

Figure 1:
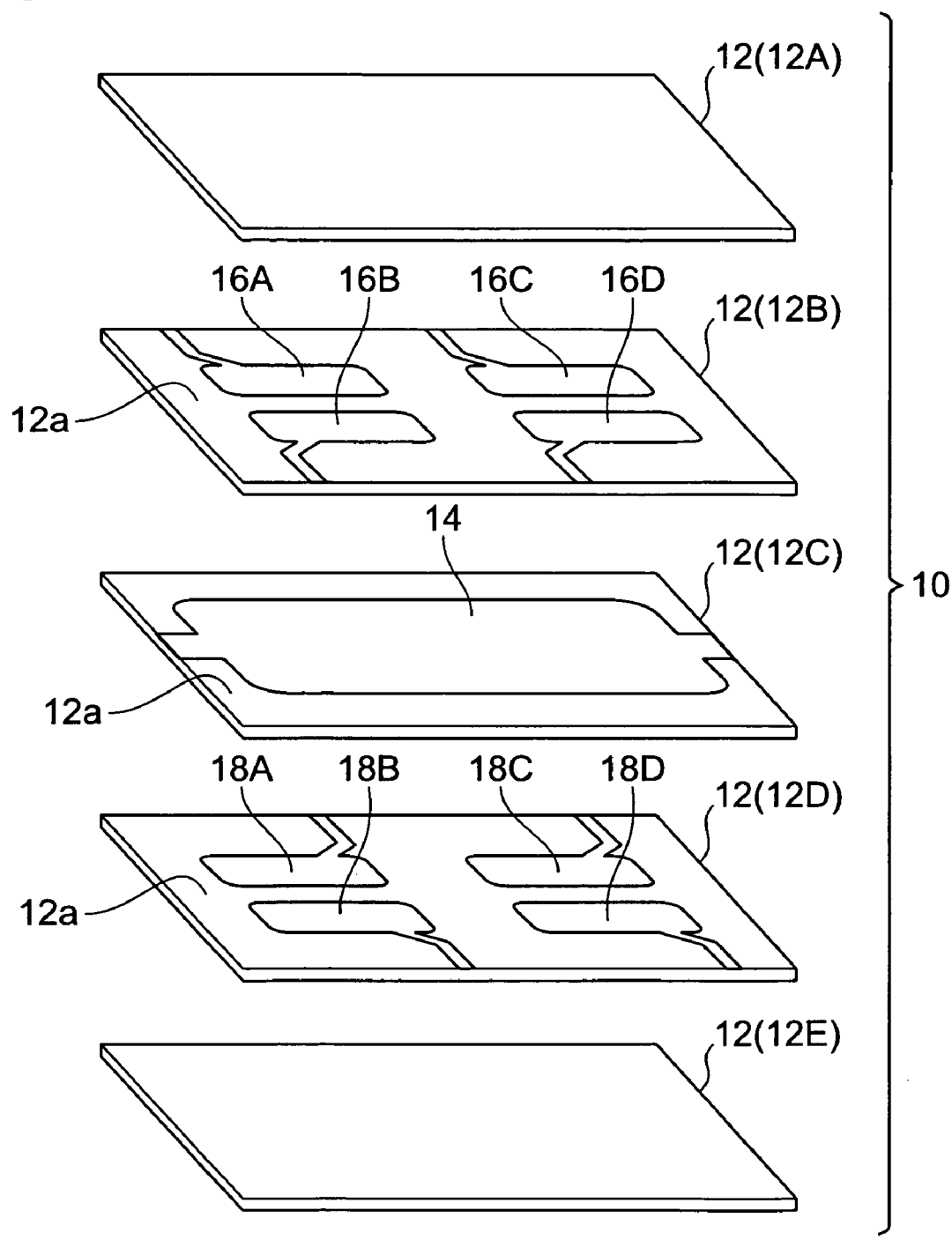
FIG. 1 is an exploded perspective view showing a capacitor according to an embodiment of the present invention.

The description will be given below using an example of a multilayer capacitor (length 2.0 mm×width 1.0 mm×thickness 0.5 mm) as a multilayer electronic component according to the present invention. FIG. 1 is an exploded perspective view showing the capacitor 10 according to an embodiment of the present invention.

The capacitor 10 consists of a stack of five functional layers 12 (12A-12E) and the functional layers are stacked in the order of 12A, 12B, 12C, 12D, and 12E. The functional layers 12 all have a rectangular thin plate shape and the same size. The functional layers 12 are made of an electrically insulating dielectric material. For example, a ceramic material consisting mainly of ZnO is applicable to the material of the functional layers 12. The functional layers 12 can be made of a dielectric material containing a principal ingredient of ZnO and additives of at least one element selected from the group consisting of Pr and Bi, Co, and Al, so as to exhibit a nonlinear current-voltage characteristic, thereby enabling utilization as a varistor. For further characteristic improvement, the material may further contain such an additive as a metal element (e.g., Cr, Ca, Si, K, etc.) other than those described above.

A ground electrode 14 is formed by pattern printing on a principal face 12a of the functional layer 12C located in the middle, out of the five functional layers 12A-12E. Four hot electrodes 16A-16D, 18A-18D are formed by pattern printing on a principal face 12a of each of the two functional layers 12B, 12D adjacent above and below to the functional layer 12C.

For convenience' sake of description, the functional layer 12C located in the middle among the five functional layers 12A-12E will be referred to as a ground electrode layer. The functional layer 12B located above the ground electrode layer 12C will be referred to as an upper capacitive electrode layer and the hot electrodes 16A-16D formed on the upper capacitive electrode layer 12B will be referred as upper hot electrodes. The functional layer 12D located below the ground electrode layer 12C will be referred to as a lower capacitive electrode layer and the hot electrodes 18A-18D formed on the lower capacitive electrode layer 12D will be referred to as lower hot electrodes.

Figure 2:
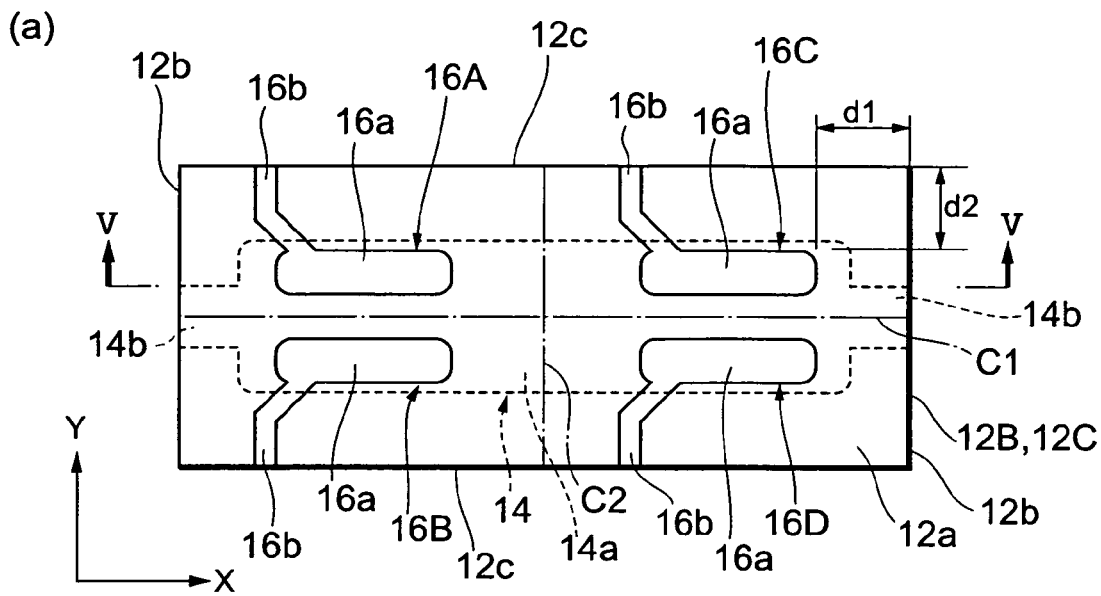
FIG. 2 is plan views of stacked functional layers.
Figure 2:
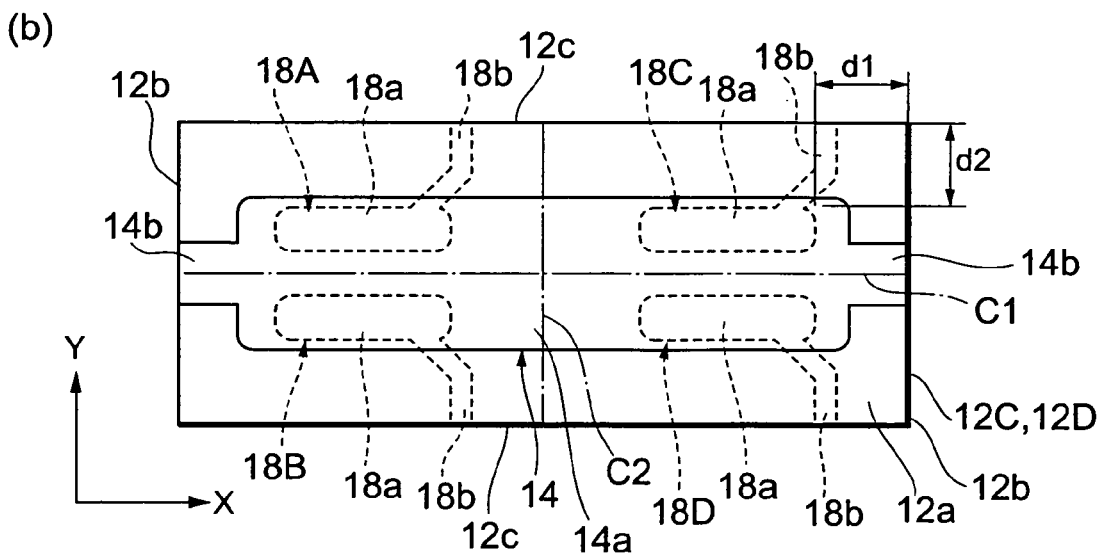

The shapes of the above-described ground electrode 14 and the hot electrodes 16A-16D, 18A-18D and positional relationship among them will be described below with reference to FIG. 2. FIG. 2 is plan views of the stacked functional layers 12. In FIG. 2, (a) is a plan view showing a state in which the upper capacitive electrode layer 12B and the ground electrode layer 12C are stacked, and in FIG. 2, (b) is a plan view showing a state in which the ground electrode layer 12C and the lower capacitive electrode layer 12D are stacked.

As shown in FIG. 2(a), the four upper hot electrodes 16A-16D on the upper capacitive electrode layer 12B are mutually identical in shape (or they are in a relation of mirror images) and each of them is composed of a capacitive electrode portion 16a and a lead electrode portion 16b.

Each capacitive electrode portion 16a of the four upper hot electrodes 16A-16D formed on the upper capacitive electrode layer (first capacitive electrode layer) 16 has the same shape as the others, and is of a nearly rectangular strip shape extending along the longitudinal direction (X-direction in FIG. 2) of the upper capacitive electrode layer 12B, and the four corners thereof are curvilinearly chamfered. The four capacitive electrode portions 16a of the upper hot electrodes 16A-16D are arrayed in two rows so as to be symmetrical with respect to a center line C1 of the upper capacitive electrode layer 12B extending in the X-direction. The four capacitive electrode portions 16b of the upper hot electrodes 16A-16D are arrayed in two rows so as to be also symmetrical with respect to a center line C2 of the upper capacitive electrode layer 12B extending in the transverse direction (Y-direction in FIG. 2) of the upper capacitive electrode layer 12B. Namely, the four capacitive electrode portions 16a on the upper capacitive electrode layer 12B are arranged in line symmetry with respect to each of the two center lines C1, C2 of the upper capacitive electrode layer 12B and arranged in a matrix of 2×2 located at the four corners of the upper capacitive electrode layer 12B.

The capacitive electrode portions 16a each are located at an equal distance d1 from an edge pair (first edge pair) 12b, 12b of the upper capacitive electrode layer 12B extending in the Y-direction and at an equal distance d2 from an edge pair (second edge pair) 12c, 12c of the upper capacitive electrode layer 12B extending in the X-direction.

Each lead electrode portion 16b of the upper hot electrodes 16A-16D is a portion of a uniform-width line shape extending from the corresponding capacitive electrode portion 16a to the edge 12c of the upper capacitive electrode layer 12B, and is once obliquely led out and then extends along the Y-direction to the edge 12c, to be electrically connected to an unrepresented terminal electrode on an end face of the element. The lead electrode portions 16b are mutually identical in shape (or they are in a relation of mirror images) and are arranged in line symmetry with respect to the center line C1 of the upper capacitive electrode layer 12B.

The ground electrode 14 of the ground electrode layer 12C is composed of a main body portion 14a extending in the X-direction, and a pair of end portions 14b extending along the X-direction from the main body portion 14a to the edges 12b. The main body portion 14a has a rectangular strip shape the four corners of which are curvilinearly chamfered, and is arranged so as to completely enclose regions corresponding to the respective upper hot electrodes 16A-16D on the upper capacitive electrode layer 12B. When the upper capacitive electrode layer 12B is laid on the ground electrode layer 12C, as shown in FIG. 2(a), the capacitive electrode portions 16a on the upper capacitive electrode layer 12B are superposed over the ground electrode 14 on the ground electrode layer 12C. Each of the end portions 14b is electrically connected to an unrepresented terminal electrode on an end face of the element.

As shown in FIG. 2(b), the four lower hot electrodes 18A-18D on the lower capacitive electrode layer 12D are mutually identical in shape (or they are in a relation of mirror images) as the upper hot electrodes 16A-16D are, and each of them is composed of a capacitive electrode portion 18a and a lead electrode portion 18b.

Each capacitive electrode portion 18a of the four lower hot electrodes 18A-18D formed on the lower capacitive electrode layer (second capacitive electrode layer) 12D has the same shape as the capacitive electrode portions 16a of the upper hot electrodes 16A-16D and the same shape as the others, and is of a nearly rectangular strip shape extending along the longitudinal direction (X-direction in FIG. 2) of the lower capacitive electrode layer 12D. The four capacitive electrode portions 18a on the lower capacitive electrode layer 12D are located at the same positions as the corresponding capacitive electrode portions 16a on the upper capacitive electrode layer 12B described above. The capacitive electrode portions 18a of the lower hot electrodes 18A-18D on the lower capacitive electrode layer 12D are also arranged in line symmetry with respect to each of two center lines C1, C2 of the lower capacitive electrode layer 12D and arranged in a matrix of 2×2 located at the four corners of the lower capacitive electrode layer 12D.

The capacitive electrode portions 18a each are located at an equal distance d1 from an edge pair (first edge pair) 12b, 12b of the lower capacitive electrode layer 12D extending in the Y-direction and at an equal distance d2 from an edge pair (second edge pair) 12c, 12c of the lower capacitive electrode layer 12D extending in the X-direction.

Each lead electrode portion 18b of the lower hot electrodes 18A-18D is also a portion of a uniform-width line shape extending from the corresponding capacitive electrode portion 18a to the edge 12c of the lower capacitive electrode layer 12D, as in the case of the upper hot electrodes 16A-16D, and is once obliquely led out and then extends along the Y-direction to the edge 12c, to be electrically connected to an unrepresented terminal electrode on the end face of the element. The lead electrode portions 18b are mutually identical in shape (or they are in a relation of mirror images) and are arranged in line symmetry with respect to the center line C1 of the lower capacitive electrode layer 12D.

Figure 3:
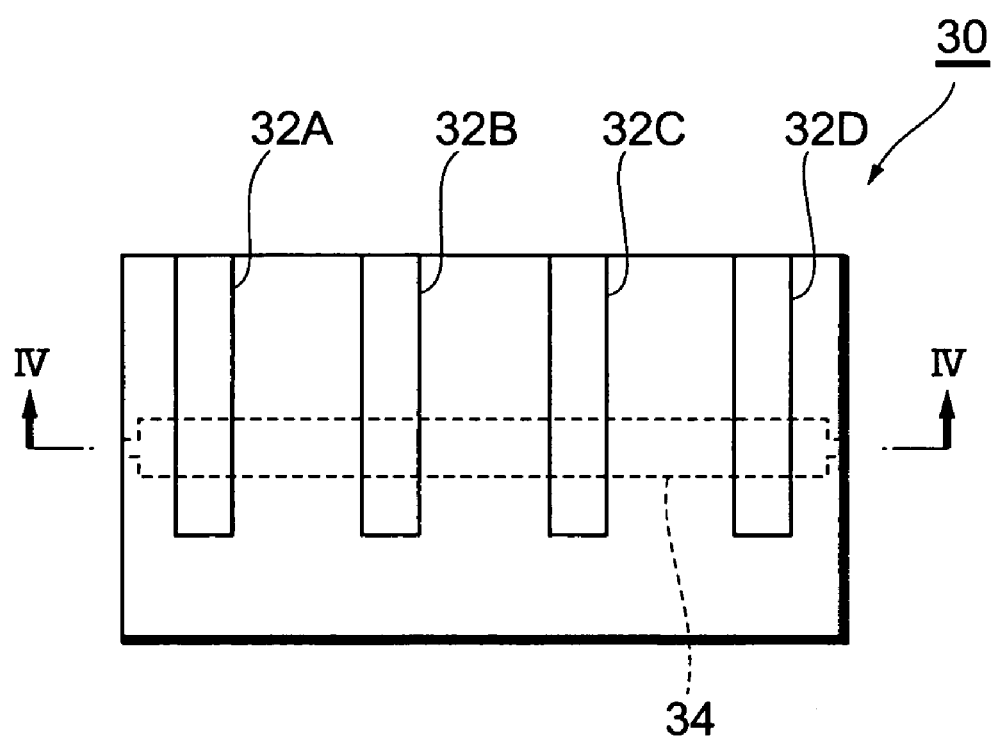
FIG. 3 is a plan view showing a stack state of a part of a capacitor according to the conventional technology.

Now, let us explain the positional relationship between the hot electrodes and the ground electrode in the capacitor according to the conventional technology, with reference to FIG. 3. FIG. 3 is a plan view showing a stack state of a part of the capacitor 30 according to the conventional technology. In FIG. 3, reference symbols 32A-32D denote hot electrodes formed in the same layer and symbol 34 denotes a ground electrode formed in a lower layer below the hot electrode layer.

The four hot electrodes 32A-32D all have a rectangular shape and extend in parallel in a state in which they are separated at equal intervals. The ground electrode 34 also has a rectangular shape and extends along the row direction of the hot electrodes 32A-32D so as to be perpendicular to the hot electrodes 32A-32D.

In the conventional capacitor 30, as shown in FIG. 3, three or more hot electrodes 32A-32D were arranged in juxtaposition in a row. For example, where four hot electrodes are arranged in a row as shown in FIG. 3, the capacitances of the hot electrodes (or their capacitive electrode portions) located inside in the row direction are different from the capacitances of the hot electrodes (or their capacitive electrode portions) located outside, which was shown by the result of the following experiment by the inventors.

The experiment was carried out as follows: the capacitors prepared were capacitor #1 equivalent to the capacitor 30 shown in FIG. 3 and capacitor #2 equivalent to the capacitor 10 shown in FIG. 1, and the capacitances between the four respective capacitive electrode portions (portions facing the ground electrode in the hot electrodes) and the ground electrode of these capacitors #1, #2 were measured as CH1-CH4. The dielectric material making the capacitors #1, #2, adopted herein, was a material containing $ZnO$, $Pr_6O_{11}$, $CoO$, $Cr_2O_3$, $CaCO_3$, $SiO_2$, $K_2CO_3$, and $Al_2O_3$ (the permittivity: 456). The size of the capacitive electrode portions of the hot electrodes in each capacitor was 0.63 mm×0.235 mm.

The measurement result was as listed in Table 1 below. CH1, CH2, CH3, and CH4 of the capacitor #1 in Table 1 correspond to the respective capacitances of the hot electrodes 32A, 32B, 32C, and 32D in the capacitor 30. CH1, CH2, CH3, and CH4 of the capacitor #2 in Table 1 correspond to the respective capacitances of the hot electrodes 16A, 16B, 16C, and 16D in the capacitor 10.

TABLE 1

| CAPACITOR #1 | CAPACITANCE (pF) | CAPACITOR #2 | CAPACITANCE (pF) |
| --- | --- | --- | --- |
| CH1 | 15.01 | CH1 | 14.63 |
| CH2 | 16.49 | CH2 | 14.58 |
| CH3 | 16.62 | CH3 | 14.81 |
| CH4 | 14.96 | CH4 | 14.85 |

As seen from this Table 1, the capacitances of CH1-CH4 are significantly different from each other in the capacitor #1, and the capacitances of CH1 and CH4 located inside are smaller than those of the other two. In the capacitor #2, the capacitances of CH1-CH4 are substantially equal and the capacitances of CH1 and CH4 are not much different from those of the other two.

Figure 4:
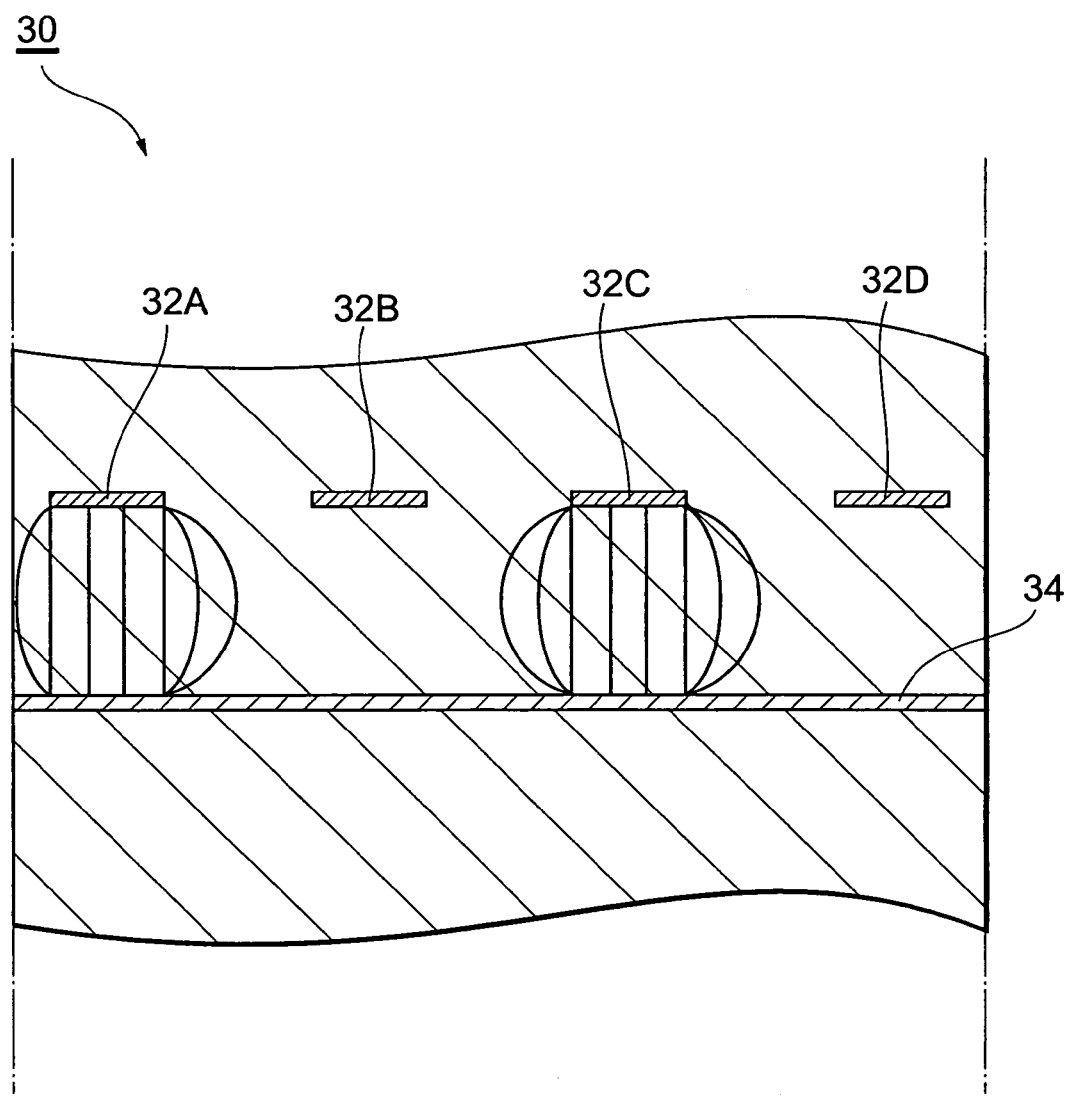
FIG. 4 is a sectional view along line IV-IV of the conventional capacitor shown in FIG. 3.
Figure 5:
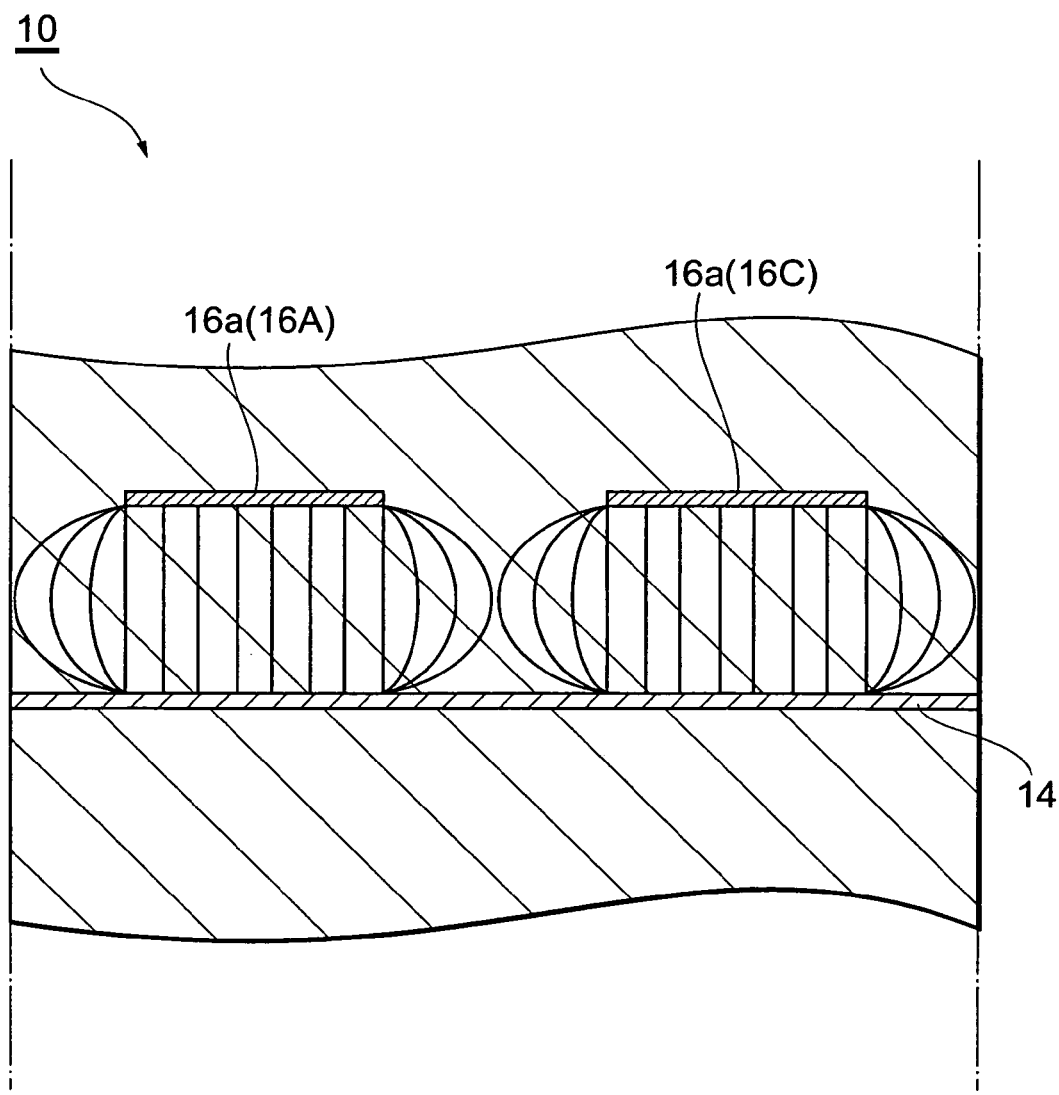
FIG. 5 is a sectional view along line V-V of the capacitor shown in FIGS. 1 and 2.

This is believed to be due to influence of electric fields as shown in FIG. 4 and FIG. 5. FIG. 4 is a sectional view along line IV-IV of the conventional capacitor 30 shown in FIG. 3, and FIG. 5 a sectional view along line V-V of the capacitor 10 shown in FIGS. 1 and 2. In the conventional capacitor #1, the electric field of the hot electrode 32A corresponding to CH1 was distorted by influence of the capacitor end face 30a located in proximity thereto, and, as a result, it was different from the electric field of the hot electrode 32C corresponding to CH3 (cf. FIG. 4). This is believed to be the reason why the capacitances of the hot electrodes 32B, 32C located inside are different from those of the hot electrodes 32A, 32D located outside in the conventional capacitor #1.

In the capacitor #2, the capacitive electrode portions 16a are formed at the equal distances d1, d2 from the end faces. For this reason, there is no substantial difference in the electric fields among the capacitive electrode portions 16a (cf. FIG. 5). For this reason, it is considered that the capacitances of CH1-CH4 in the capacitor #2 are substantially equal.

The inventors also measured each of the capacitances of the hot electrodes 18A, 18B, 18C, 18D in the capacitor 10 as CH1, CH2, CH3, and CH4, and they were found to be 14.49 pF, 14.36 pF, 14.36 pF, and 14.28 pF; it was thus confirmed that the substantially equal capacitances were also achieved as in the aforementioned case of 16A-16D.

In the capacitor 10, as detailed above, the capacitive electrode portions 16a of the four hot electrodes 16A-16D are each at the equal distance d1 from the first edge pair 12b and at the equal distance d2 from the second edge pair 12c. For this reason, the distributions of electric fields between the respective capacitive electrode portions 16a and the ground electrode 14 are equalized, which realizes uniformization of the capacitances in the four respective capacitive electrode portions 16a.

The same also applies to the hot electrodes 18A-18D as in the case of the hot electrodes 16A-16D and in the capacitor 10 the capacitive electrode portions 18a of the four hot electrodes 18A-18D are each at the equal distance d1 from the first edge pair 12b and at the equal distance d2 from the second edge pair 12c. For this reason, the distributions of electric fields between the respective capacitive electrode portions 18a and the ground electrode 14 are equalized, which realizes uniformization of the capacitances in the four respective capacitive electrode portions 18a.

As described above, the capacitor 10 according to the embodiment of the present invention has the hot electrodes 16A-16D, 18A-18D four each on the upper and lower sides of the ground electrode on the ground electrode layer 12C, and is thus provided with a total of eight hot electrodes 16A-16D, 18A-18D and eight capacitive electrode portions 16a, 18a. Since these eight capacitive electrode portions 16a, 18a are arranged as described above, uniformization of the capacitances is achieved among the respective capacitive electrode portions 16a, 18a.

A multilayer electronic component with the above-described capacitor 10 as a capacitor section will be described below with reference to FIG. 6.

Figure 6:
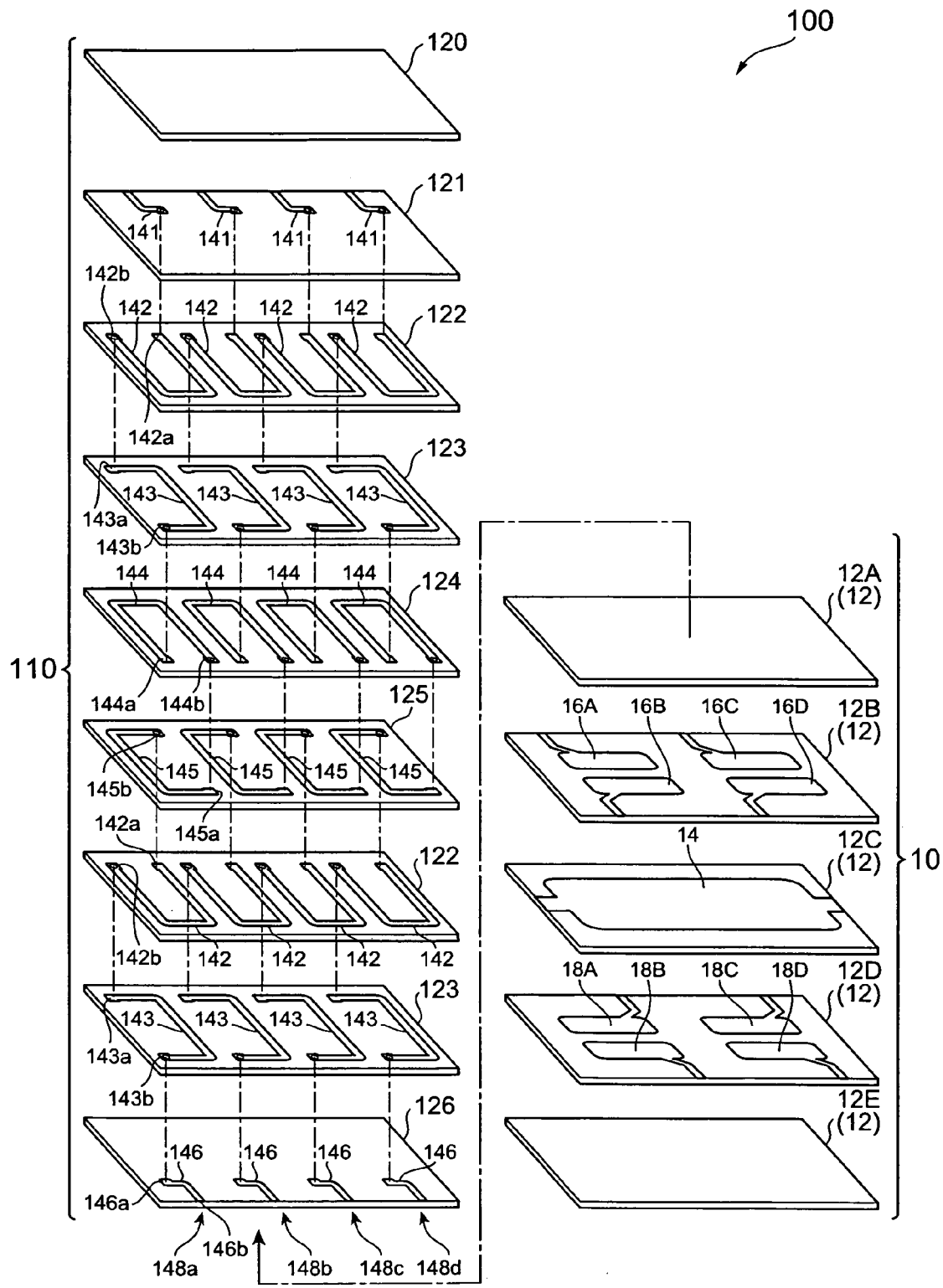
FIG. 6 is an exploded perspective view showing a multilayer filter according to an embodiment of the present invention.

FIG. 6 is an exploded perspective view showing a multilayer filter according to an embodiment of the present invention. The multilayer filter 100 shown in FIG. 6 is a type of multilayer electronic component and, more particularly, is a multilayer filter array component in which four filter elements each composed of an inductor and a capacitor are arranged in a row. The multilayer filter 100 has the size of length 2.0 mm×width 1.0 mm×thickness 0.8 mm and is composed of an inductor section 110 and a capacitor section 10.

In the inductor section 110, nine functional layers 120, 121, 122, 123, 124, 125, 122, 123, 126 are stacked in order. The functional layers 120-126 are made of an electrically insulating material. For example, a ceramic material consisting mainly of ZnO is applicable to the constituent material of the functional layers 120-126. The ceramic material making the functional layers may contain such metal elements as Pr, K, Na, Cs, and Rb as additives, in addition to ZnO. A magnetic material such as ferrite can also be used as the constituent material of the functional layers 120-126.

Four conductor patterns 141, 142, 143, 144, 145, 142, 143, or 146 are disposed on one principal face of each of the plurality of functional layers 121, 122, 123, 124, 125, 122, 123, and 126, respectively. The four conductor patterns 141 are juxtaposed in a direction perpendicular to the stack direction of the functional layers 120-126. Each set of four conductor patterns 142-146 are also juxtaposed in the same direction as above.

The conductor patterns 141, 146 are provided as leads to terminal electrodes, and the conductor patterns 142-145 are formed in a coil shape in order to increase the inductance. In other words, the conductor patterns 142-145 have a U-shape formed along sides of a nearly rectangular shape.

One ends 141a of the four conductor patterns 141 are disposed each along one edge of the functional layer 121. The other ends 141b of the four conductor patterns 141 are connected through through-hole conductors to respective one ends 142a of the four conductor patterns 142. The other ends 142b of the four conductor patterns 142 are connected through through-hole conductors to respective one ends 143a of the four conductor patterns 143 and the other ends 143b of the four conductor patterns 143 are connected through through-hole conductors to respective one ends 144a of the four conductor patterns 144. The other ends 144b of the four conductor patterns 144 are connected through through-hole conductors to respective one ends 145a of the four conductor patterns 145 and the other ends 145b of the four conductor patterns 145 are connected through through-hole conductors to respective one ends 142a of the four conductor patterns 142.

Similarly, the other ends 142b of the four conductor patterns 142 are connected through through-hole conductors to respective one ends 143a of the four conductor patterns 143 and the other ends 143b of the four conductor patterns 143 are connected through through-hole conductors to respective one ends 146a of the four conductor patterns 146. The other ends 146b of the four conductor patterns 146 are disposed each along one edge of the functional layer 126.

As described above, the conductor patterns 142-146 adjacent in the stack direction in the inductor section 110 are connected in series in each set to form the four inductor conductors 148a, 148b, 148c, 148d.

In the multilayer filter 100, the capacitor section 10 in the same configuration as the aforementioned capacitor is laid below the inductor section 110 having the configuration as described above. The inductor conductors of the inductor section 110 are electrically connected through unrepresented terminal electrodes extending in the stack direction, to the hot electrodes in the capacitor section 10, and the multilayer filter 100 is a composite electronic component functioning as a π-type LC filter.

In this multilayer filter 100, as in the capacitor 10, the capacitive electrode portions 16a of the four hot electrodes 16A-16D are each at the equal distance d1 from the first edge pair 12b and at the equal distance d2 from the second edge pair 12c, so as to equalize the distributions of electric fields between the respective capacitive electrode portions 16a and the ground electrode 14, which realizes uniformization of the capacitances in the four respective capacitive electrode portions 16a.

The hot electrodes 18A-18D are also constructed in the same configuration as the hot electrodes 16A-16D, and in this multilayer filter 100, as in the capacitor 10, the capacitive electrode portions 18a of the four hot electrodes 18A-18D are also each at the equal distance d1 from the first edge pair 12b and at the equal distance d2 from the second edge pair 12c, so as to equalize the distributions of electric fields between the respective capacitive electrode portions 18a and the ground electrode 14, which realizes uniformization of the capacitances in the four respective capacitive electrode portions 18a.

The present invention is not limited to the above embodiments, but can be modified in various ways. For example, only the π-type multilayer filter was described as the multilayer filter, but it may be modified in an L-type multilayer filter as occasion may demand. Only the LC filter (filter with the capacitor function) was described as the multilayer filter, but, if necessary, the design of the capacitor part may be modified into a filter with a varistor function.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer electronic component comprising:
   a first capacitive electrode layer of a rectangular shape on which four capacitive electrode portions are formed at four corners; and
   a ground electrode layer which is laid on the first capacitive electrode layer and on which a ground electrode is formed so as to be arranged as superposed over the four capacitive electrode portions;
   wherein the four capacitive electrode portions are equidistant from a first facing edge pair of the first capacitive electrode layer and equidistant from a second facing edge pair different from the first edge pair.

2. The multilayer electronic component according to claim 1, further comprising:
   a second capacitive electrode layer on which four capacitive electrode portions are formed and which is laid so as to sandwich the ground electrode layer between the second capacitive electrode layer and the first capacitive electrode layer,
   wherein the four capacitive electrode portions are arranged as superposed over the ground electrode on the ground electrode layer and are equidistant from a first facing edge pair of the second capacitive electrode layer and equidistant from a second facing edge pair different from the first edge pair.

3. The multilayer electronic component according to claim 2, further comprising an inductor section.

4. The multilayer electronic component according to claim 1, further comprising an inductor section.

* * * * *